United States Patent [19]

Kooi

[11] 3,718,843

[45] Feb. 27, 1973

[54] COMPACT SEMICONDUCTOR DEVICE FOR MONOLITHIC INTEGRATED CIRCUITS

[75] Inventor: Else Kooi, Emmasingel, Eindhoven, Netherlands

[73] Assignee: U.S. Philips Corporation, New York, N.Y.

[22] Filed: July 8, 1971

[21] Appl. No.: 160,653

[30] Foreign Application Priority Data

July 10, 1970 Netherlands ........................7010205

[52] U.S. Cl...........317/235 R, 317/235 E, 317/235 F

[51] Int. Cl...............................................H01l 19/00

[58] Field of Search..........312/235 E, 235 F, 235 AK

[56] References Cited

UNITED STATES PATENTS 3,500,139 3/1970 Fvouin et al..........................317/235

3,597,287 8/1971 Koepp..................................317/235

*Primary Examiner*—Jerry D. Craig

*Attorney*—Frank R. Trifari

[57] ABSTRACT

A semiconductor device having a semiconductor body which comprises an island-shaped region of a first conductivity type which is fully surrounded within the body by a region, preferably a buried layer, of the second conductivity type and an adjoining surface zone of the second conductivity type. According to the invention said surface zone is formed by a preferably diffused zone which adjoins an inset oxide pattern which fully surrounds the island. As a result of this, monolithic circuits of high packing density can be obtained, the buried layer with the island and a further surface zone of the second conductivity type present therein preferably forming a transistor.

7 Claims, 7 Drawing Figures

Figure 1:
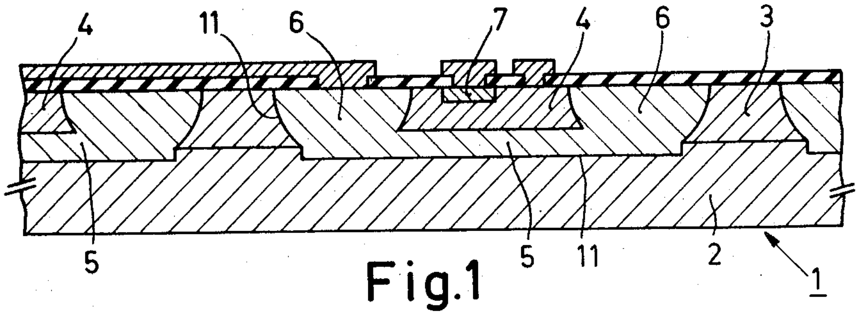

INVENTOR.

ELSE KOOI

BY

AGENT

INVENTOR.

ELSE KOOI

BY

AGENT

COMPACT SEMICONDUCTOR DEVICE FOR MONOLITHIC INTEGRATED CIRCUITS

The invention relates to a semiconductor device having a semiconductor body comprising at least an island-shaped region of a first conductivity type which adjoins a surface of the body, comprises at least a semiconductor circuit element, and is substantially entirely bounded within the body by a region of the second conductivity type which extends below said island and by a surface zone of the second conductivity type which also adjoins the said surface and adjoins the region.

Semiconductor devices of the type described are known and are used in particular in monolithic integrated circuits to obtain islands which are electrically isolated from each other. In this case, an epitaxial layer of the opposite conductivity type is usually provided on a substrate of the one conductivity type and is then divided into islands by a separation or isolation diffusion of the one conductivity type.

Another known example are the structures described by Murphy and others in "Proceedings I.E.E.E.", September, 1969, pp. 1523–1528. In these structures the said region of the second conductivity type is formed by a buried layer which extends between a substrate and an epitaxial layer which are both of the first conductivity type. Each island is bounded by a separate cohering separation region of the second conductivity type which consists of the said buried layer and the adjoining surface zone. This structure provides a considerable space saving as compared with the above-mentioned more conventional method of island isolation.

The invention is inter alia based on the recognition of the fact that drawbacks which, in given circumstances, are highly undesirable are associated with the said known structures. In certain cases, for example, an undesirable transistor action may occur as a result of the transistor structure which is formed by two juxtaposed islands of the one conductivity type which are separated by a separation diffusion of the second conductivity type, the separation diffusion operating as a base of said stray or parasitic transistor. Undesirable high capacities can also occur between the metallisation of a monolithic circuit and an underlying separation diffusion via the conventional intermediate thin oxide layer.

The invention is furthermore based on the recognition of the fact that, when using the above structure described by Murphy, in spite of the space saving which can be obtained with said newer known structure, and which saving is already considerable, the minimum mutual distance of the resulting isolated island-shaped regions is restricted to a boundary value which, inter alia, is given by the normal methods and prevents a further space saving which is desirable for large component packing densities. This is caused inter alia by the fact that the said surface zone, which generally is provided by diffusion from the surface, has a width at said surface which is at least equal to twice, in general, however, larger than three times, the distance between the buried layer and the surface, as a result of the lateral diffusion parallel to the surface. So in these known structures, the isolated islands are situated at a mutual distance which generally is larger than six times the distance between the buried layer and the surface increased by the necessary mutual distance of the surface zones belonging to adjacent islands to avoid stray transistor action.

One of the objects of the invention is to provide a semiconductor device of a new structure which is particularly suitable for use in monolithic integrated circuits having a high packing density and in which the restrictions of the above-described known structures are considerably reduced.

For that purpose, the invention is furthermore based on the recognition of the fact that, in order to reach the end in view, an inset or sunken oxide pattern having an adjoining doped zone which adjoins a region of the same conductivity type may advantageously be used.

According to the invention, a semiconductor device of the type mentioned in the preamble is therefore characterized in that the body comprises an electrically insulating oxide pattern of which at least a part is inset in the semiconductor body, said inset part fully surrounding the said island, the said surface zone of the second conductivity type being formed by a zone which adjoins said inset part and which separates the inset oxide from the island.

In this application, when several juxtaposed insulating layers are present, the said oxide inset pattern is to be understood to mean an oxide layer which is thicker than and extends to a larger depth than an adjacent insulating layer.

Since the surface zones of the second conductivity type belonging to adjacent islands are separated by the inset oxide pattern entirely or at least for a considerable part of their depth, the said stray transistor action in the device according to the invention via a separation diffusion is avoided, while, should the case arise, the capacity between the metallisation and the separation diffusion is also drastically restricted.

As compared with the described structure of Murphy and other, the structure according to the invention inter alia has the additional important advantage that the width of the preferably diffused surface zone, and hence the mutual distance between two adjacent islands, can be considerably smaller than in the known structures. Two-dimensionally, said decrease in distance involves an increase of the possible packing density which, roughly is proportional to the second power of said decrease in distance. As a result of this, and due to the presence of the inset oxide below the metallisation, several capacities of the device are reduced at the same time so that the electric behavior at high frequencies is considerably better than in corresponding devices which are constructed according to known structures. In connection herewith, an important preferred embodiment according to the invention is characterized in that the region of the second conductivity type above which the island is present is formed by a buried layer.

In this case, for example for the formation of a cross-over, the regions of the second conductivity type which surround two adjacent islands, may be connected together should the case present itself, for example, in that the islands are present above a common buried layer or in that their surface zones of the second conductivity type are connected together. In most cases, however it will be desirable that the islands are separated entirely electrically from each other. Therefore, a further important preferred embodiment is characterized in that the surface zone and the buried layer form a coherent region which is separated from the island by a first p-n junction and is separated from the remaining part of the body by a second p-n junction which adjoins the inset oxide surrounding the islands.

Although, generally, an island will preferably be entirely surrounded by the buried layer and the adjoining surface, for example, a small aperture may be present in the buried layer, if desirable, for example, for contacting the collector zone of a transistor present in the island.

The device according to the invention may comprise one single island-shaped region of the first conductivity type which is insulated from the remaining part of the semiconductor body by the said coherent region of the second conductivity type, in which part semiconductor circuit elements may be present. The invention is of particular interest, however, in integrated circuits having several islands which are insulated from each other and which adjoin the same surface of the semiconductor body.

In connection herewith an important preferred embodiment according to the invention is characterized in that the inset oxide is provided in the form of grid or grating which fully surrounds at least two separated island-shaped parts of the semiconductor surface, a surface zone of the second conductivity type which adjoins the inset oxide extending along the whole edge of each of the said parts, said surface zones adjoining buried layers of the second conductivity type which extend below each of the said parts of the surface and forming therewith regions of the second conductivity type which each fully surround a said island-shaped region of the first conductivity type.

In this preferred embodiment a considerable space saving is obtained as compared with known similar monolithic circuits.

The island or the islands of the first conductivity type may comprises circuit elements which are present on or in the island. Such a circuit element may be, for example, a metal-semiconductor diode (Schottky diode), a metal-oxide-semiconductor (MOS) capacity or a vapor-deposited resistor. The invention, however, is of particular advantage in the devices in which at least a zone of the second conductivity type which adjoins the surface and which is fully surrounded by the island-shaped region is present in at least an island-shaped region of the first conductivity type. In such a device it is desirable that a certain distance exists between the said zone of the second conductivity type and the surface zone of the second conductivity type adjoining the buried layer so as to prevent undesirable transistor action between said zones, so that in this case an optimum space saving in other parts of the structure is particularly desirable.

In this embodiment, the zone of the second conductivity type present in the island will preferably be present at such a distance from the buried layer that said zone, together with the island-shaped region and the buried layer, forms a transistor the island-shaped region of which of the first conductivity type is the base zone. This transistor may be used as such or form part of a multilayer structure, for example, a p-n-p-n structure which can be obtained by providing a further surface zone of the first conductivity type which is fully surrounded by the said zone of the second conductivity type present in the island.

The buried layer and the adjoining, preferably diffused, surface zone of the second conductivity type can be provided in a homogeneous body of the first conductivity type without the use of epitaxial growth, for example, by providing the buried layer at a certain depth below the surface by ion implantation according to known methods. However, the semiconductor body preferably comprises a substrate region of the first conductivity type on which an epitaxial layer of the first conductivity type is present, the buried layer (or layers) being present between the substrate region and the epitaxial layer.

Although not strictly necessary, the device according to the invention will be constructed, from a point of view of maximum space saving, preferably so that the coherent region of the second conductivity type formed by the buried layer and the adjoining surface zone forms part of the semiconductor circuit element formed in or on the island.

Figure 2:
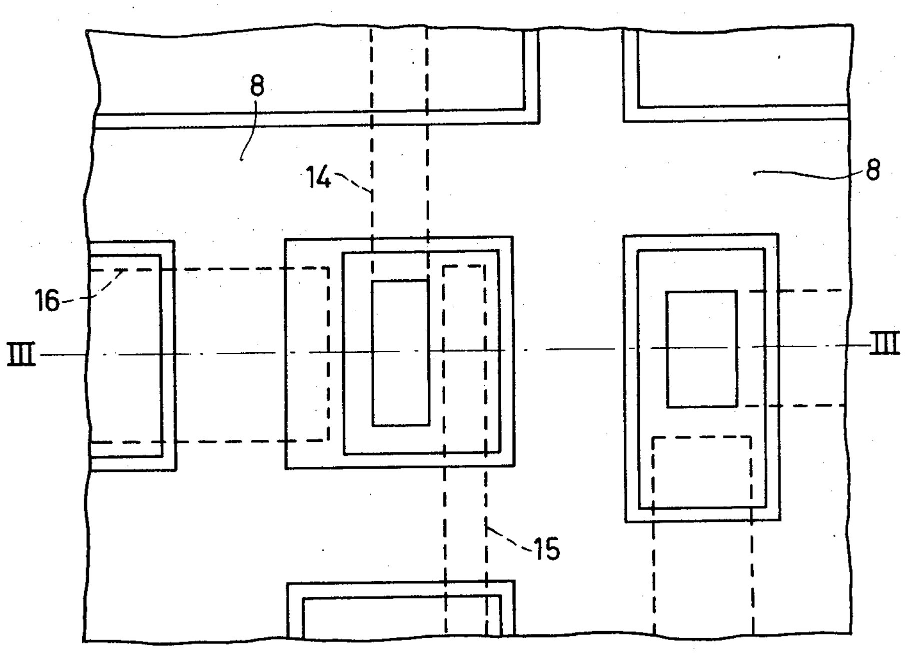
Figure 3:
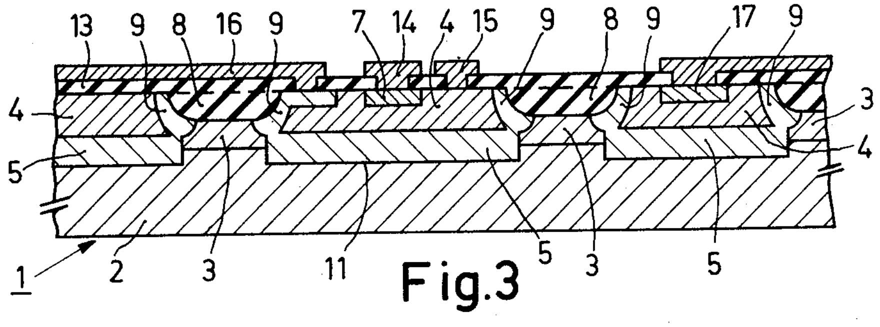
Figure 4:
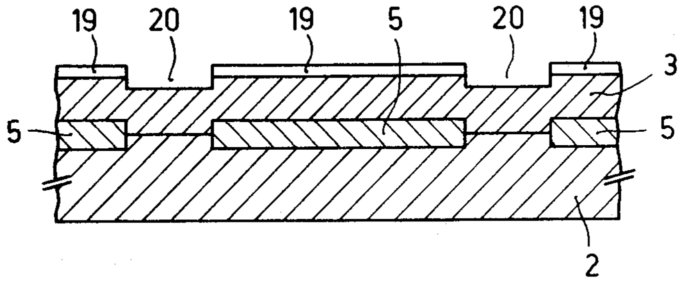
Figure 5:
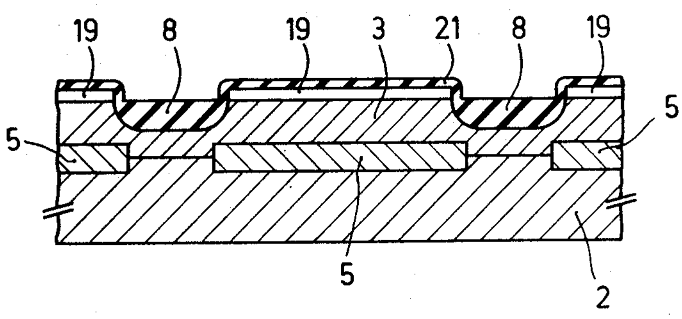
Figure 6:
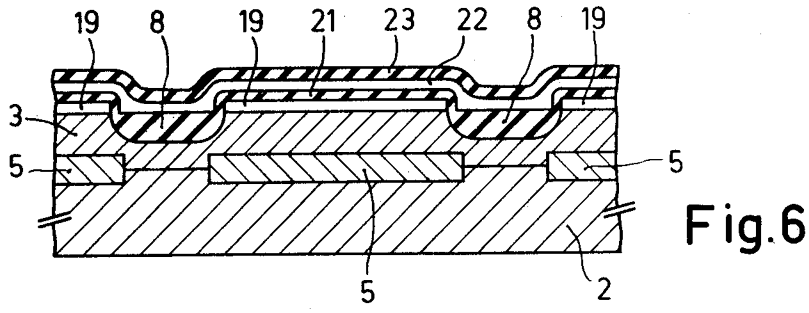
Figure 7:
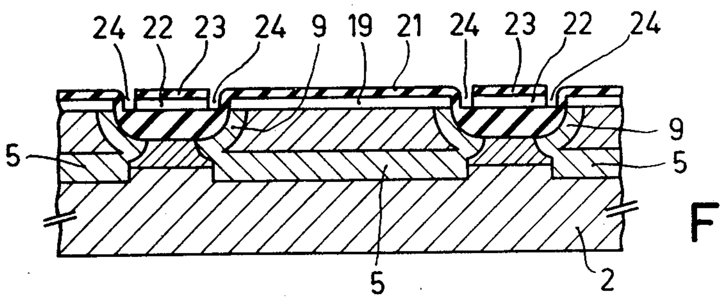

In order that the invention may be readily carried into effect, a few embodiments thereof will now be described in greater detail, by way of example with reference to the accompanying drawings, in which FIG. 1 is a diagrammatic cross-sectional view of a known semiconductor device, FIG. 2 is a diagrammatic plan view of a semiconductor device according to the invention, FIG. 3 is a diagrammatic cross-sectional view of the device shown in FIG. 2 taken on the line III—III of FIG. 2, and FIGS. 4 to 7 are diagrammatic cross-sectional views of the device shown in FIGS. 2 and 3 during various stages of manufacture.

The Figures are diagrammatic and not drawn to scale, notably the dimensions in the direction of the thickness being considerably exaggerated for clarity. Corresponding components in the Figures are generally referred to by the same reference numerals.

FIG. 1 is a diagrammatic cross-sectional view of a known device. This device comprises a semiconductor body 1 of silicon having an n-type substrate 2 on which an n-type epitaxial layer 3 is present. An island-shaped region 4 of said layer 3 adjoining the surface is fully surrounded within the body by a p-type buried layer 5 which extends below said island 4 and by a diffused p-type surface zone 6 which likewise adjoins the surface and which adjoins the buried layer 5 and forms therewith a coherent p-type region which is fully surrounded within the body by n-type silicon. A p-type surface zone 7 is present in the island-shaped region 4 and forms the emitter zone of a p-n-p transistor of which the other active zones are formed by the region 4 (the base zone) and the region (5,6) (the collector zone).

Since the zone 6 has to extend substantially throughout the thickness of the layer 3, the width (lateral dimension) of said zone 6 at the surface, as a result of the lateral diffusion, is at least equal to two times, and in general larger than three times, the distance between the buried layer 5 and the surface even upon diffusion through windows of minimum widths. Also as a result of the minimum distance which must necessarily be maintained between the zones 6 which surround two adjacent island-shaped regions 4 to prevent stray transistor action between the said zones 6, the mutual distance of two adjacent insulated islands 4 in this known structure is still comparatively large.

FIG. 2 is a plan view and FIG. 3 a diagrammatic cross-sectional view taken on the line III—III of FIG. 2 of a semiconductor device according to the invention. Like the known device shown in FIG. 1, said device comprises an n-type substrate 2 on which an epitaxial n-type layer 3 is present, while local p-type buried layers 5 are present between the substrate 2 and the layer 3. The substrate 2 consists of n-type silicon having a resistivity of 1 ohm. cm and a thickness of 200 microns, the layer 3 being formed by n-type silicon having a resistivity of 0.1 ohm. cm and a thickness of 3 microns.

However, in this device island-shaped regions 4 are obtained from the layer 3 in a way different from the known device. According to the invention, the body comprises an electrically insulating oxide pattern of which a part 8 (bounded in FIG. 3 on top by broken lines) is inset in the semiconductor body. The island-shaped region 4 is fully surrounded by said inset oxide (see FIG. 2), a p-type zone 9 which separates the inset oxide 8 from the island 4 and which bounds a part of said inset oxide 8 adjoining said oxide 8. This zone 9 adjoins the buried layer 5 and forms therewith a coherent p-type region which fully surrounds the island 4 and which, except for the inset oxide 8, is surrounded only by n-type semiconductor material and forms a p-n junction 11 with said n-type material (see FIG. 3).

As in FIG. 1, a p-type surface zone 7 present in the said island-shaped region 4 (see FIG. 3) is fully surrounded by said island 4. This surface zone 7 together with the region 4 surrounding the zone 7 and the underlying buried layer 5 forms a transistor, the zone 7 of which is used as the emitter, the island-shaped region 4 being the base, and the layer 5 with the adjoining zone 9 being the collector. Via windows in an oxide layer 13 present on the surface, the zones 7, 4 and 9 adjoin the metal layers 14, 15 and 16. The transistor is electrically separated from the remaining part of the silicon body 1 by the p-n junction 11 which in the operating condition is connected in the reverse direction by connecting the n-type substrate 2 to the highest potential of the circuit.

In this example the inset oxide 8 is provided in the form of a grating or grid (see FIG. 2) as a result of which the surface not covered by the inset oxide 8 is divided into islands separated from each other by the oxide pattern 8. FIGS. 2 and 3 shown two of the said islands in their entirety namely the island in which the above-described transistor is present and a juxtaposed island which comprises a diode which is formed by the n-type island 4 and a p-type zone 17 present in said island.

As compared with the known structure described with reference to FIG. 1, the device according to the invention inter alia has the important advantage that the zones 9 may be very thin and the width of the inset oxide parts 8 need be only so large that stray transistor action between zones 9 belonging to adjacent islands is prevented. As a result of this, the area required per insulated element is considerably smaller in the device according to the invention than in the known structure. Moreover, the capacity of the p-n junction 11 is smaller than in the known structure. This is due in particular to the fact that in the known structure (see FIG. 1) particularly the upper part of the p-n junction 11 which adjoins the highly doped part of the zone 6 which is present nearest to the surface contributes to the capacity of said p-n junction 11 and in the device according to the invention said part is absent by using the oxide pattern 8. Furthermore, in the device according to the invention the capacity between the wiring and the semiconductor body at the area of the inset oxide 8 is considerably reduced and the possibility of formation of inversion channels as a result of the metal layers present on the oxide is also considerably reduced at said area.

The structure shown in FIGS. 2 and 3 can be manufactured in various manners, for example, as follows (see FIGS. 4 to 7). Starting material (see FIG. 4) is a structure manufactured according to methods conventionally used in semiconductor technology and consisting of n-type substrate 2 and an n-type epitaxial layer 3 having thicknesses and dopings as described above and p-type buried layers 5 having a boron doping of $10^{18}$ at./ccm. On said layer 3, a layer 19 of silicon nitride, 0.15 micron thick, is provided by heating in an atmosphere containing $SiH_4$ and $NH_3$ at a temperature of approximately 1000°C. A layer of silicon oxide not shown is provided on said layer 19 by heating in an atmosphere containing $SiH_4$, $CO_2$ and $H_2$. For all the details of the methods to be used for providing the silicon nitride and silicon oxide layers mentioned in this example, as well as for the masking and etching of said layers, reference is made to Philips Research Reports, April 1970, pp. 118–132,Canadian Pat. No. 826,343 and U.S. Pat. No. 3,544,858 in which publications all the information is given which is necessary for those skilled in the art. Reference is also made to a concurrently filed copending application Ser. No. 160,654 which describes and claims other methods for making this and similar structures.

While using photoresist methods generally used in semiconductor technology, an annular aperture is etched in said double layer of silicon nitride and silicon oxide, after which the said oxide layer is removed in a HF buffer solution and grooves 20, 0.8 micron deep, (see FIG. 4) are then etched in the layer 3 by etching with a liquid consisting of 170 ccm of 60% $NHO_3$, 280 ccm of fuming $NHO_3$, 110 ccm of 40% HF and 440 ccm of glacial acetic acid at 2°C.

The silicon surface in the grooves 20 is then oxidized at 1000°C by oxidation in water vapor saturated at 95°C, the nitride layer 19 being also covered with a thin oxide layer 21, the oxidation being continued until in the grooves 20 an oxide pattern 8 has formed the upper surface of which coincides substantially with the interface between the layers 3 and 19.

A layer 22 of silicon nitride is then provided (see FIG. 6) on the surface by means of the already mentioned methods and said layer is covered with a layer 23 of silicon oxide. By using a photoresist method, the oxide layer 23 is locally etched away after which, while using the remaining parts of the layer 23 as a mask, apertures 24 are etched in the nitride layer 24, see FIG. 7. The first nitride layer 19 is maintained, it being covered with the oxide layer 21 which is substantially not attacked by the etchant (usually phosphoric acid) with which the nitride is etched away. As will be observed the windows 24 are located over the inset oxide 8 offset from the feature islands 4.

Gallium is then indiffused. This is carried out for 15 minutes at 1050°C in argon using gallium-doped silicon powder as a source. The gallium diffuses through the oxide but is masked by the silicon nitride. The result is an approximately 0.7 micron thick p-type zone 9 (see FIG. 7) which adjoins the buried p-type layer 5 of which in this example the distance to the surface is approximately 2 microns. It will be obvious that the grooves 20 in this way of manufacture must be at least so wide that after the gallium diffusion the zones 9 which belong to juxtaposed islands 4, do not touch each other and show no adverse stray transistor action with the intermediately located part of the layer 3. As will also be observed from the shape of zones 9 in FIG. 7, and due to the offset location of the diffusion windows 24, the gallium impurity gradient in the zones 9 will be generally laterally and substantially transverse to the interface between the inset oxide 8 and the zones 9.

After removing the layers 19, 21, 22 and 23, by means of a further oxidation and masking step, the emitter zone 7, the zone 17, and the part of the zone 9 to which the base contact layer 16 is connected can then be simultaneously provided in the resulting structure by means of a boron diffusion, after which the structure shown in FIG. 2 is obtained. If desirable, the last-mentioned zones may also be provided simultaneously with the zones 9 in one gallium diffusion step when for that purpose the required apertures are first etched in the layers 19 and 21.

The method described has been given only by way of example and the device described may also advantageously be manufactured according to several other methods, for example, that described in the concurrently filed patent application Ser. No. 160,654.

In addition to the transistor and diode mentioned in the examples described, other semiconductor circuit elements, for example resistors, p-n-p-n elements, and so on, may of course also be manufactured in the islands 4. Instead of in an island 4, one or more of these elements may also be present fully or partly in the form of conductive layers, for example, metal layers, on the island-shaped region or on the oxide layer 13. It is furthermore not necessary for the region formed by the buried layer 5 and the zones 9 to form part of the said circuit elements, although this is highly desirable from a point of view of space saving.

It will be obvious that the invention is not restricted to the examples described. The doping of the different zones, instead of by diffusion, may be effectuated by other means such as ion implantation, or the diffusions may be carried out starting from a doped oxide layer as a diffusion source. For example, the buried layer 5, as already mentioned, may also be provided by ion implantation or epitaxially. In particular, instead of silicon, other semiconductor materials may be used which can form a useful oxide pattern, for example, silicon carbide.

What is claimed is:

1. A semiconductor device comprising a semiconductor body, said semiconductor body having a first conductivity type substrate portion and a major surface, a first island-shaped region of said first conductivity type within said body and adjoining said surface, a second region of a second conductivity type within the body and extending below the first region, a third surface zone of the second conductivity type within the body and adjoining the said surface and extending down to the second region such that the first region is substantially entirely bounded by the second region and the third zone which jointly form a coherent region which is separated from the first region by a first p-n junction and is separated from the remaining part of the substrate portion by a second p-n junction, an electrically insulating oxide pattern at least partly inset in the body and fully laterally surrounding the first region but being spaced therefrom by and adjoining the third zone, a portion of the third zone adjoining the inset oxide having a decreasing impurity gradient along a line substantially transverse to the interface of the said portion and the inset oxide, said third zone portion being thin measured along the aforementioned line relative to the depth of the first region in the body, and a semiconductor circuit element built within or incorporating said first region.

2. A semiconductor device as claimed in claim 1 wherein the second region of the second conductivity type is a buried layer, and the second p-n junction adjoins the inset oxide surrounding the first region.

3. A semiconductor device as claimed in claim 2 wherein the inset oxide is provided in the form of a grid which fully surrounds at least two separated island-shaped first regions of the semiconductor body, third surface zones of the second conductivity type which adjoins the inset oxide extending along the whole periphery of each of the said two regions, said third surface zones adjoining buried layers of the second conductivity type which extend below each of the said first regions and forming therewith regions of the second conductivity type, which each fully surround a said first region of the first conductivity type.

4. A semiconductor device as claimed in claim 2 wherein at least a fourth zone of the second conductivity type and which adjoins the surface and which is fully surrounded by the first region is present in at least a first region of the first conductivity type, 5. A semiconductor device as claimed in claim 2 wherein the coherent region of the second conductivity type consisting of the buried layer and the adjoining surface zone forms part of the said semiconductor circuit element.

6. A semiconductor device as claimed in claim 4 wherein the said fourth zone of the second conductivity type, the island-shaped first region of the first conductivity type, and the buried layer of the second conductivity type form a transistor.

7. A semiconductor device as claimed in claim 2 wherein the semiconductor body comprises a substrate region of the first conductivity type on which an epitaxial layer of the first conductivity type is present and that the buried layer is present between the substrate region and the epitaxial layer.

* * * * *